United States Patent
Sansbury

[19]

[11] Patent Number: 5,914,904
[45] Date of Patent: *Jun. 22, 1999

[54] COMPACT ELECTRICALLY ERASABLE MEMORY CELLS AND ARRAYS

[75] Inventor: James D. Sansbury, Portola Valley, Calif.

[73] Assignee: Altera Corporation, San Jose, Calif.

[21] Appl. No.: 08/941,904

[22] Filed: Sep. 30, 1997

Related U.S. Application Data

[60] Provisional application No. 60/027,179, Oct. 1, 1996.

[51] Int. Cl.$^6$ .................................................. G11C 7/00
[52] U.S. Cl. ............... 365/218; 365/185.01; 365/185.29; 365/185.28; 365/104; 365/175
[58] Field of Search ..................................... 365/104, 218, 365/154, 185.28, 208, 115, 175, 185.29, 185.01

[56] References Cited

U.S. PATENT DOCUMENTS

| | | | |
|---|---|---|---|
| 4,132,904 | 1/1979 | Harari | 307/238 |
| 4,546,454 | 10/1985 | Gupta et al. | 365/200 |
| 4,596,938 | 6/1986 | Cartwright, Jr. | 307/279 |
| 4,609,986 | 9/1986 | Hartmann et al. | 364/200 |
| 4,617,479 | 10/1986 | Hartmann et al. | 307/465 |
| 4,628,487 | 12/1986 | Smayling | 365/185 |
| 4,652,773 | 3/1987 | Cartwright, Jr. | 307/469 |
| 4,677,318 | 6/1987 | Veenstra et al. | 307/465 |
| 4,695,979 | 9/1987 | Tuvell et al. | 365/185 |
| 4,713,792 | 12/1987 | Hartmann et al. | 364/900 |
| 4,715,014 | 12/1987 | Tuvell et al. | 365/185 |
| 4,742,492 | 5/1988 | Smayling et al. | 365/218 |
| 4,829,203 | 5/1989 | Ashmore, Jr. | 307/469 |
| 4,871,930 | 10/1989 | Wong et al. | 307/465 |
| 4,885,719 | 12/1989 | Brahmbhatt | 365/181 |
| 4,899,067 | 2/1990 | So et al. | 307/465 |
| 4,912,342 | 3/1990 | Wong et al. | 307/465 |
| 4,924,119 | 5/1990 | Lee | 307/469 |
| 4,935,648 | 6/1990 | Radjy et al. | 307/468 |
| 4,979,146 | 12/1990 | Yokoyama et al. | 365/185 |
| 5,005,155 | 4/1991 | Radjy et al. | 365/185 |
| 5,016,217 | 5/1991 | Brahmbhatt | 365/185 |
| 5,021,693 | 6/1991 | Shima | 307/494 |
| 5,028,810 | 7/1991 | Castro et al. | 307/201 |
| 5,043,941 | 8/1991 | Sakamoto | 365/185 |
| 5,097,449 | 3/1992 | Cuevas | 365/228 |
| 5,121,006 | 6/1992 | Pedersen et al. | 307/465 |
| 5,241,224 | 8/1993 | Pedersen et al. | 307/465 |
| 5,247,478 | 9/1993 | Gupta et al. | 365/185 |
| 5,260,610 | 11/1993 | Pedersen et al. | 307/465 |
| 5,260,611 | 11/1993 | Cliff et al. | 307/465 |
| 5,350,954 | 9/1994 | Patel et al. | 307/465 |
| 5,353,248 | 10/1994 | Gupta | 365/154 |
| 5,457,653 | 10/1995 | Lipp | 365/185.18 |
| 5,581,504 | 12/1996 | Chang | 365/185.17 |
| 5,666,307 | 9/1997 | Chang | 365/185.03 |
| 5,691,939 | 11/1997 | Chang et al. | 365/165.18 |
| 5,706,227 | 1/1998 | Chang et al. | 365/185.18 |
| 5,736,764 | 4/1998 | Chang | 257/318 |
| B1 4,617,479 | 9/1993 | Hartmann et al. | 307/465 |

FOREIGN PATENT DOCUMENTS

| | | |
|---|---|---|
| WO 94/22142 | 9/1994 | WIPO . |
| WO 96/01474 | 1/1996 | WIPO . |
| WO 96/01499 | 1/1996 | WIPO . |

*Primary Examiner*—David Nelms
*Assistant Examiner*—Thong Le
*Attorney, Agent, or Firm*—Townsend and Townsend and Crew LLP

[57] ABSTRACT

A nonvolatile memory cell (600) has a read device (510), program device (515), and tunnel diode (535). A write control line (WC) is directly coupled to the tunnel diode (535). The memory cell (500) may be used to form compact arrays of memory cells to store logical data. During programming of a selected memory cell, half-select voltages are used on the write control (WC) and control gate lines (CG) for unselected memory cells to prevent disturb and minimize oxide stress.

39 Claims, 9 Drawing Sheets

FIG. 9  4 x 2 CELL ARRAY SHOWING REPEAT PATTERN

COMPACT ELECTRICALLY ERASABLE MEMORY CELLS AND ARRAYS

This application claims the benefit of U.S. Provisional Application No. 60/027,179, filed Oct. 1, 1996, incorporated herein by reference.

BACKGROUND OF THE INVENTION

The present invention relates to the field of integrated circuit memory technology. More specifically, the present invention provides a compact nonvolatile memory cell in which a write control line is directly coupled to a tunnel diode of the memory cells, and techniques of operating, programming, and erasing such a memory cell to enhance the reliability and service life of the memory cell.

Memory cells are used in the implementation of many types of electronic devices and integrated circuits. These devices include microprocessors, static random access memories (SRAMs), erasable-programmable read only memories (EPROMs), electrically erasable programmable read only memories (EEPROMs), Flash EEPROM memories, programmable logic devices (PLDs), field programmable gate arrays (FPGAs), and application specific integrated circuits (ASICs), among others. Memory cells are used to store the data and other information for these and other integrated circuits.

As integrated circuit technology and semiconductor processing continue to advance, there is a need for greater densities and functionality in integrated circuits, which are often determined in a large part by the size of the memory cells. Therefore, it is desirable to achieve memory cells with smaller cell sizes. Further, it is desirable that the memory cells have improved operating characteristics, such as lower power consumption, nonvolatility, greater device longevity, improved data retention, better transient performance, superior voltage and current attributes, and improvements in other similar attributes.

There is further a need to provide techniques for programming and erasing the memory cells reliably. For example, during the program operation, unselected memory cells which are not to be configured should be left undisturbed. There is further a need for improved techniques of evaluating the physical characteristics of nonvolatile memory cells. These physical characteristics or properties are important in the determination of an integrated circuit's service life and reliability. These measurements are also useful for study and use in improving memory cells.

As can be seen, improved memory cells and techniques for operating, programming, and erasing these cells are needed. Improved techniques are also needed for increasing the reliability and longevity of these memory devices.

SUMMARY OF THE INVENTION

The present invention provides a compact nonvolatile memory cell to store logical data. The memory cell may be used to form arrays of memory cells. A write control line for the memory cell is directly coupled to a tunnel diode of the memory cell. During programming of a selected memory cell, unselected memory cells are not disturbed, and oxide stress for the unselected memory cells is minimized. The present invention also provides techniques for operating, programming, and erasing the memory cell. During the configuration of a selected memory cell, half-select voltages may be used on a control gate line and write control line of the memory cell to prevent disturb of unselected memory cells.

Specifically, the memory cell of the present invention includes: a first transistor coupled between a DL line and an internal node, wherein a control electrode of the first transistor is coupled to an RL line; a second transistor coupled between the internal node and an SL line, where the second transistor includes a floating gate coupled to a CG line; and a write control line coupled directly to a tunnel diode of the memory cell. For the memory cell, the write control line is connected to the tunnel diode without passing through a transistor device. The memory cell further includes a tunnel dielectric, where charge is transferred between the tunnel diode and the floating gate through the tunnel dielectric.

Furthermore, half-select voltages are coupled to unaccessed CG and WC lines in an array of memory cells to avoid disturbing a state of unaccessed cells. In particular, a technique of the present invention includes: providing voltage to control lines of a selected memory cell to place the selected memory cell in a desired configured state; and providing a first half-select voltage to a first control line of an unselected memory cell, where the first half-select voltage is an intermediate voltage between ground and a $V_{PP}$ voltage. Further, a second half-select voltage may be provided to a second control line of the unselected memory cell. The first and second half-select voltages may be different. Furthermore, in an embodiment of the layout of the memory cell of the present invention, the first and second control line are transverse.

Other objects, features, and advantages of the present invention will become apparent upon consideration of the following detailed description and the accompanying drawings, in which like reference designations represent like features throughout the figures.

DETAILED DESCRIPTION OF THE PREFERRED EMBODIMENTS

Figure 1:
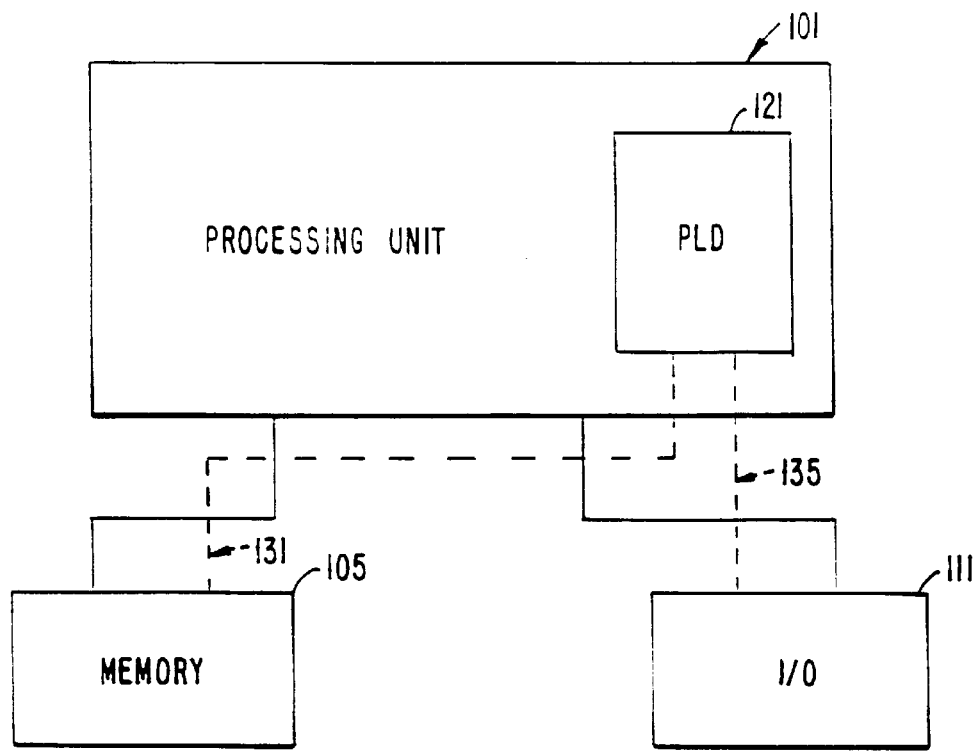
FIG. 1 is a block diagram of a digital system incorporating a programmable logic device integrated circuit.

FIG. 1 shows a block diagram of a digital system within which the present invention may be embodied. The system may be provided on a single board, on multiple boards, or even within multiple enclosures. FIG. 1 illustrates a system 101 in which a programmable logic device 121 may be utilized. Programmable logic devices (sometimes referred to as a PALs, PLAs, FPLAs, PLDs, CPLDs, EPLDs, EEPLDs, LCAs, or FPGAs), are well known integrated circuits that provide the advantages of fixed integrated circuits with the flexibility of custom integrated circuits. Such devices allow a user to electrically program standard, off-the-shelf logic elements to meet a user's specific needs. See, for example, U.S. Pat. No. 4,617,479, incorporated herein by reference for all purposes. Such devices are currently represented by, for example, Altera's MAX® series of PLDs and FLEX® series of PLDs. The former are described in, for example, U.S. Pat. Nos. 5,241,224 and 4,871,930, and the *Altera Data Book*, June 1996, all incorporated herein by reference in their entirety for all purposes. The latter are described in, for example, U.S. Pat. Nos. 5,258,668, 5,260,610, 5,260,611, and 5,436,575, and the *Altera Data Book*, June 1996, all incorporated herein by reference in their entirety for all purposes. Logic devices and their operation are well known to those of skill in the art.

In the particular embodiment of FIG. 1, a processing unit 101 is coupled to a memory 105 and an I/O 111 and incorporates a programmable logic device (PLD) 121. PLD 121 may be specially coupled to memory 105 through connection 131 and to I/O 111 through connection 135. The system may be a programmed digital computer system, digital signal processing system, specialized digital switching network, or other processing system. Moreover, such systems may be designed for a wide variety of applications such as, merely by way of example, telecommunications systems, automotive systems, control systems, consumer electronics, personal computers, and others.

Processing unit 101 may direct data to an appropriate system component for processing or storage, execute a program stored in memory 105 or input using I/O 111, or other similar function. Processing unit 101 may be a central processing unit (CPU), microprocessor, floating point coprocessor, graphics coprocessor, hardware controller, microcontroller, programmable logic device programmed for use as a controller, or other processing unit. Furthermore, in many embodiments, there is often no need for a CPU. For example, instead of a CPU, one or more PLDs 121 may control the logical operations of the system. In some embodiments, processing unit 101 may even be a computer system. Memory 105 may be a random access memory (RAM), read only memory (ROM), fixed or flexible disk media, PC Card flash disk memory, tape, or any other storage retrieval means, or any combination of these storage retrieval means. PLD 121 may serve many different purposes within the system in FIG. 1. PLD 121 may be a logical building block of processing unit 101, supporting its internal and external operations. PLD 121 is programmed to implement the logical functions necessary to carry on its particular role in system operation.

Figure 2:
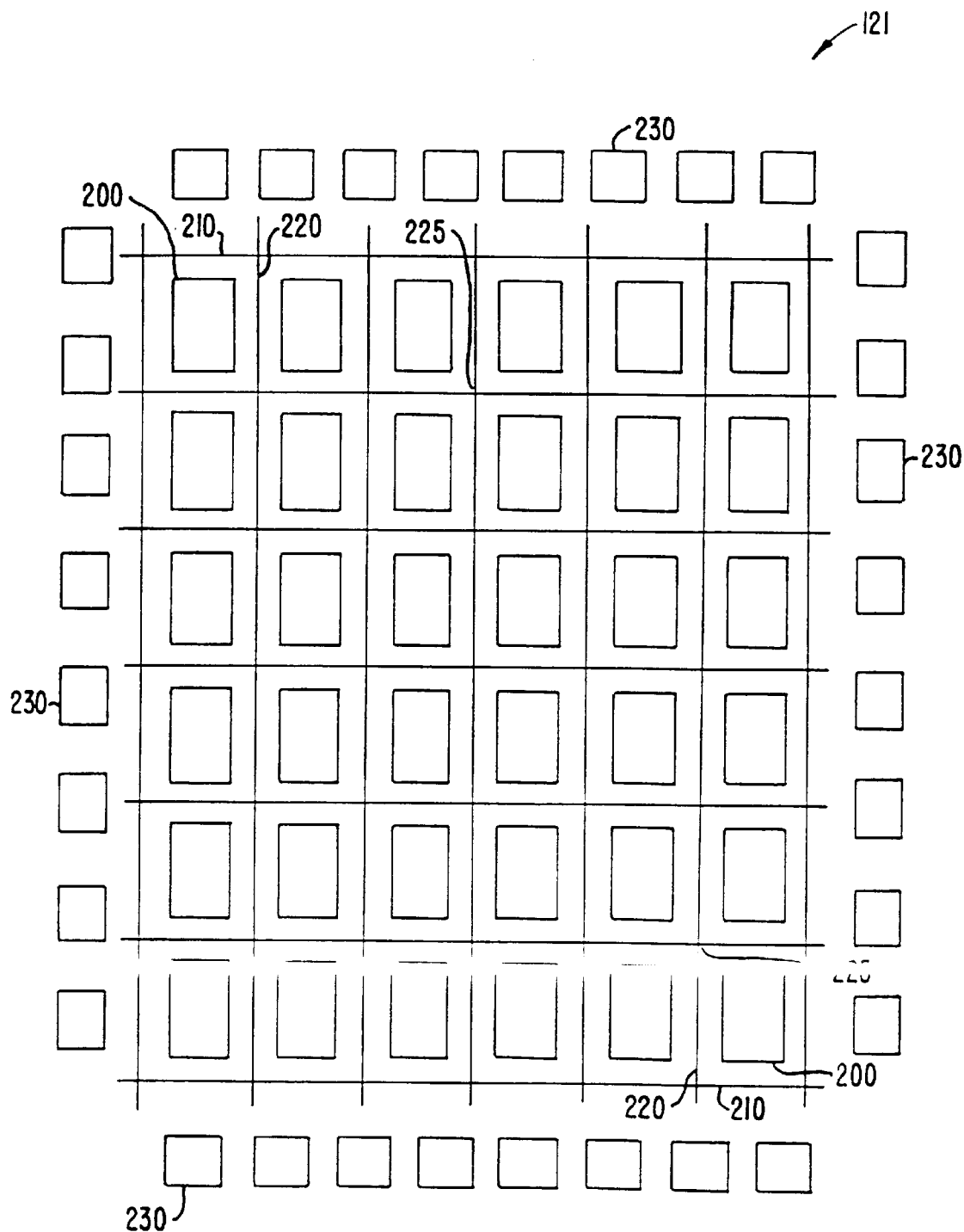
FIG. 2 is a block diagram showing the overall architecture of a programmable logic device.

FIG. 2 is a simplified block diagram of an overall internal architecture and organization of PLD 121 of FIG. 1. Many details of PLD architecture, organization, and circuit design are not necessary for an understanding of the present invention and such details are not shown in FIG. 2.

FIG. 2 shows a six-by-six two-dimensional array of thirty-six logic array blocks (LABs) 200. LAB 200 is a physically grouped set of logical resources that is configured or programmed to perform logical functions. The internal architecture of a LAB will be described in more detail below in connection with FIG. 3. PLDs may contain any arbitrary number of LABs, more or less than shown in PLD 121 of FIG. 2. Generally, in the future, as technology advances and improves, programmable logic devices with greater numbers of logic array blocks will undoubtedly be created. Furthermore, LABs 200 need not be organized in a square matrix or array; for example, the array may be organized in a five-by-seven or a twenty-by-seventy matrix of LABs.

LAB 200 has inputs and outputs (not shown) which may or may not be programmably connected to a global interconnect structure, comprising an array of global horizontal interconnects (GHs) 210 and global vertical interconnects (GVs) 220. Although shown as single lines in FIG. 2, each GH 210 and GV 220 line may represent a plurality of signal conductors. The inputs and outputs of LAB 200 are programmably connectable to an adjacent GH 210 and an adjacent GV 220. Utilizing GH 210 and GV 220 interconnects, multiple LABs 200 may be connected and combined to implement larger, more complex logic functions than can be realized using a single LAB 200.

In one embodiment, GH 210 and GV 220 conductors may or may not be programmably connectable at intersections 225 of these conductors. Moreover, GH 210 and GV 220 conductors may make multiple connections to other GH 210 and GV 220 conductors. Various GH 210 and GV 220 conductors may be programmably connected together to create a signal path from a LAB 200 at one location on PLD 121 to another LAB 200 at another location on PLD 121. A signal may pass through a plurality of intersections 225. Furthermore, an output signal from one LAB 200 can be directed into the inputs of one or more LABs 200. Also, using the global interconnect, signals from a LAB 200 can be fed back into the same LAB 200. In specific embodiments of the present invention, only selected GH 210 conductors are programmably connectable to a selection of GV 220 conductors. Furthermore, in still further embodiments, GH 210 and GV 220 conductors may be specifically used for passing signal in a specific direction, such as input or output, but not both.

The PLD architecture in FIG. 2 further shows at the peripheries of the chip, input-output drivers 230. Input-output drivers 230 are for interfacing the PLD to external, off-chip circuitry. FIG. 2 shows thirty-two input-output drivers 230; however, a PLD may contain any number of input-output drivers, more or less than the number depicted. Each input-output driver 230 is configurable for use as an input driver, output driver, or bidirectional driver.

Figure 3:
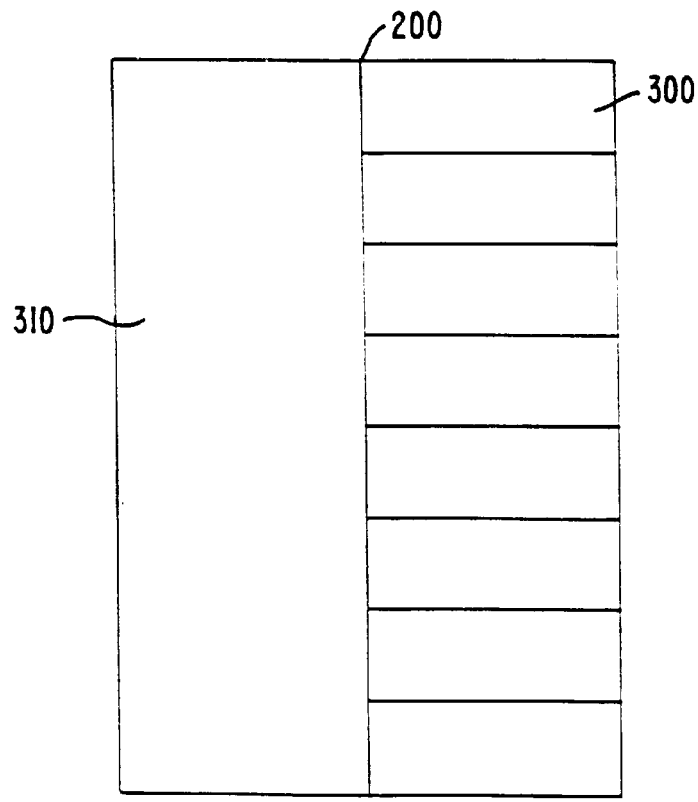
FIG. 3 is a simplified block diagram of a logic array block (LAB) of a programmable logic device.

FIG. 3 shows a simplified block diagram of LAB 200 of FIG. 2. LAB 200 is comprised of a varying number of logic elements (LEs) 300, sometimes referred to as "logic cells," and a local (or internal) interconnect structure 310. LAB 200 has eight LEs 300, but LAB 200 may have any number of LEs, more or less than eight.

A general overview of LE 300 is presented here, sufficient to provide a basic understanding of the present invention. LE 300 is the smallest logical building block of a PLD. Signals external to the LAB, such as from GHs 210 and GVs 220, are programmably connected to LE 300 through local interconnect structure 310. In one embodiment, LE 300 of the present invention incorporates a function generator that is configurable to provide a logical function of a number of variables, such a four-variable Boolean operation. As well as combinatorial functions, LE 300 also provides support for sequential and registered functions using, for example, D flip-flops.

LE 300 provides combinatorial and registered outputs that are connectable to the GHs 210 and GVs 220, outside LAB 200. Furthermore, the outputs from LE 300 may be internally fed back into local interconnect structure 310; through local interconnect structure 310, an output from one LE 300 may be programmably connected to the inputs of other LEs 300, without using the global interconnect structure's GHs 210 and GVs 220. Local interconnect structure 310 allows short-distance interconnection of LEs, without utilizing the limited global resources, GHs 210 and GVs 220.

Figure 4:
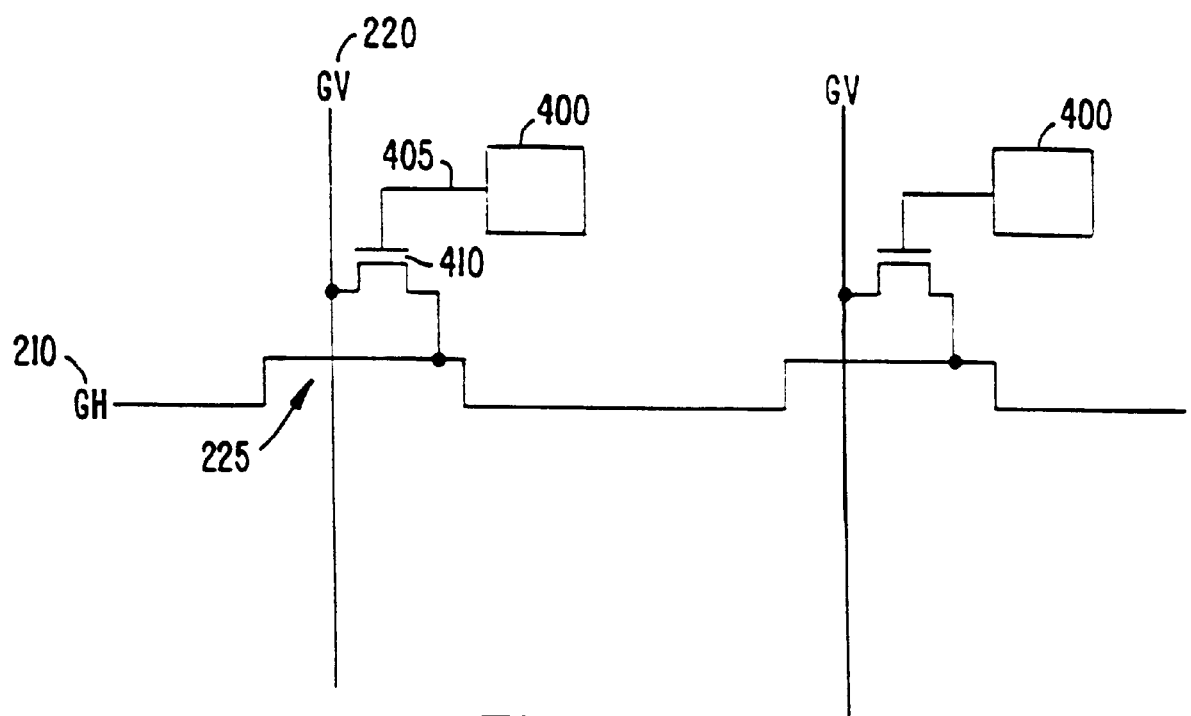
FIG. 4 is a diagram of the memory cell of the present invention used in the programmable interconnect of a programmable logic device.

FIG. 4 is a diagram showing an example of how the present invention may be used in implementing the programmable interconnection resources of a PLD such as shown in FIG. 2. In FIG. 4, GH 210 and GV 220 conductors cross at intersections 225. Intersections 225 are sometimes referred to as crosspoints. As is typically the case with global programmable interconnect, GH 210 and GV 220 lines do not connect at intersections 225 unless they are programmably coupled. In the present invention, a programmable interconnect junction 410 is used for programmably coupling GH 210 to GV 220, and vice versa. Programmable interconnect junction 410 may be programmed or configured to couple the GH 210 and GV 220 conductors together. Alternatively, programmable interconnect junction 410 may be programmed or configured to decouple the GH 210 and GV 220 conductors.

In a preferred embodiment, programmable interconnect junction 410 is reprogrammable, which means that the cell may be programmed many times with new data. Furthermore, programmable interconnect junction 410 may be nonvolatile, which means that the stored information is retained even when power is removed. For example, after programmable interconnect 410 is programmed to couple GH 210 to GV 220, the GH and GV conductors will remain coupled indefinitely until programmable interconnect 410 is reprogrammed.

Moreover, a memory cell of the present invention allows the passage of full-rail voltages between GH 210 and GV 220 conductors. For example, a component may drive $V_{CC}$ (or $V_{DD}$) $V_{SS}$, or an intermediate value between $V_{CC}$ and $V_{SS}$ from GH 210 onto GV 220. This improves the performance of the interconnect structure because components (e.g., logic blocks and logic elements) and signal lines may be driven by a stronger signal. Also, this minimizes the impact of resistances, capacitances, and other parasitics.

Figures 5A, 5B:
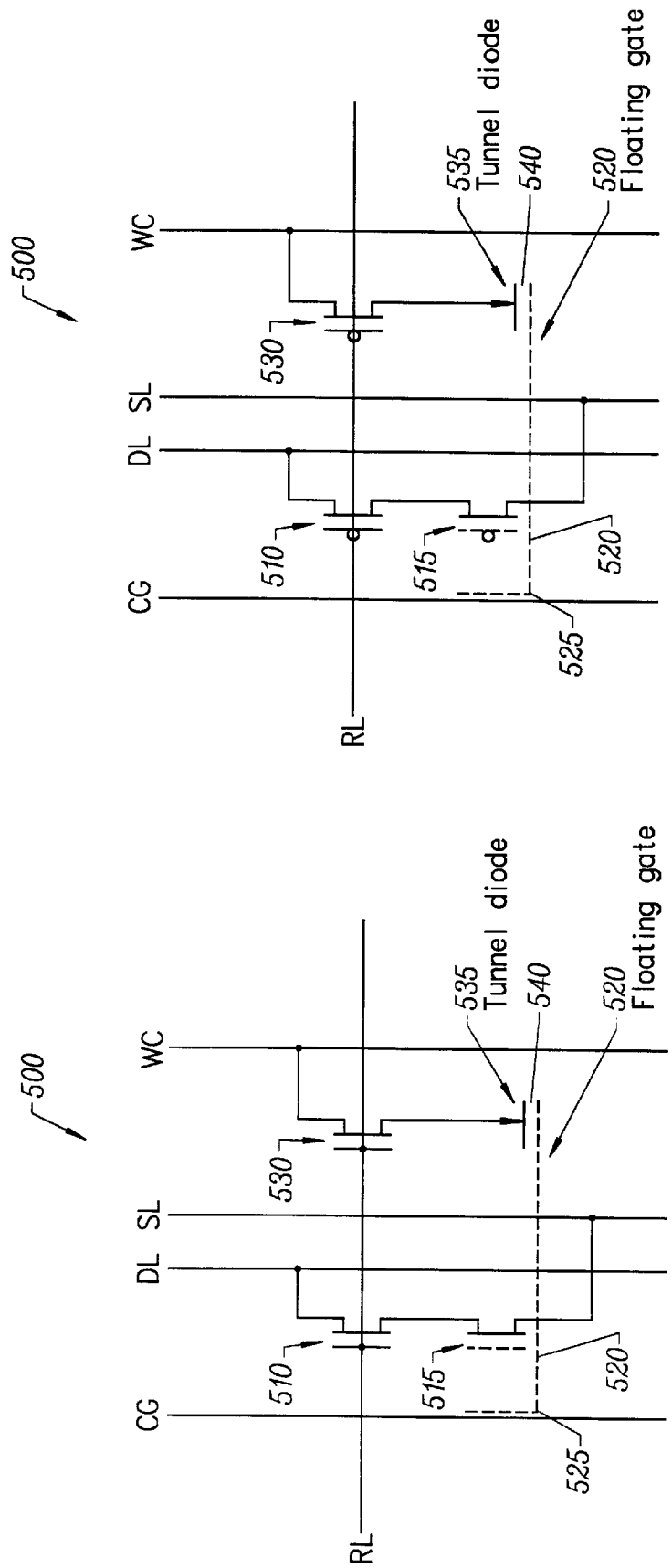
FIG. 5A shows a layout of a nonvolatile memory cell implemented using NMOS technology.
FIG. 5B shows a layout of a nonvolatile memory cell implemented using PMOS technology.

FIG. 5A is shows a diagram of a nonvolatile memory cell 500 that may be used to store data in an integrated circuit such as an EPROM or Flash memory, or PLD, or embedded within a integrated circuit with logic. This figure shows an example of a layout for memory cell 500. There are many other layout organizations for the memory cell, depending on the process technology used, silicon area available, performance criteria, and other factors.

An array of memory cells may be formed by replicating (and possibly mirroring) a single cell 500 in vertical and horizontal directions. Using this technique, an array of any arbitrary desirable size may be formed. For example, an array may be arranged in 2×2, 1024×8, 16M×1, or many other organizations. The particular organization may also be reconfigurable or dynamically reconfigurable, selected by the user. A particular cell in the array may be selectively accessed or configured by row and column. One technique, among others, is to access cells through row and column addresses and decoding.

Memory cell 500 includes a read device 510 in series with a program device 515, coupled between a drain line (DL) and a source line (SL). In an embodiment, read device 510 is an NMOS transistor having a gate coupled to a row line (RL). Program device 515 may be a floating gate device having a floating gate 520 such as a EEPROM or Flash cell. In FIG. 5A, the devices shown are n-channel or NMOS devices; however, the program device and other devices may be p-channel or PMOS devices. A memory cell may also contain combinations of NMOS and PMOS devices. However, with existing process technologies, the cell size will be more compact when all devices are of the same type due to well spacing and other factors. However, as technologies evolve, compact cell sizes will be possible with mixed device types using processes such as silicon over insulator (SOI).

A control gate (CG) line to facilitate programming and erase through a control gate coupling capacitor 525 is coupled to floating gate 520. A write control (WC) line is coupled through a write device 530 through a tunnel diode 535 to floating gate 520. In a specific embodiment, write device 530 is an NMOS transistor having a gate coupled to RL.

Tunnel diode 535 is a source of electrons for floating gate 520, which are passed through a tunnel dielectric 540 (which is a relatively thin oxide region) to floating gate 520. In a specific embodiment, the tunnel dielectric will be about 80 Angstroms to about 100 Angstroms. In other embodiments, the tunnel dielectric may be about 100 Angstroms to about 110 Angstroms. The tunnel dielectric thickness is dependent on many factors such as the process technology, and the supply voltage for the technology (e.g., 5-volt process, 3.3-volt process, or 2.5-volt process). In comparison, using present-day process technology, a gate oxide will typically be about 50 Angstroms to about 70 Angstroms, or thinner.

Although FIG. 5A is an implementation of a memory cell using an NMOS program device 515, the principles of the present invention will apply analogously to the case where program device is a PMOS or p-channel device. Devices 510, 530, and 515 may be implemented using PMOS devices, individually or in combination. This detailed description discusses operation primarily with respect to an NMOS version of the memory cell, which is generally more widely available. However, it is understood that this discussion of an NMOS memory cell would apply similarly (by duality) to the PMOS device configuration. For example, for the PMOS device configuration, the voltages and conditions applied to the cell would be reversed; e.g., "positive" values would become "negative" values, and vice versa. Aside from these differences, the principles of the present invention would apply equally as well to a PMOS memory configuration as an NMOS memory configuration. FIG. 5B shows a layout of memory cell 500 implemented using PMOS devices.

The configuration of memory cell 500 involves programming or erasing program device 515. Depending on the memory technology used, the terms "programmed" and "erased" may have different meanings. In this specification, the IEEE convention for these terms is used. Specifically, "programmed" refers to placing a switch into an "off" or nonconducting state, and "erased" refers to placing a junction into an "on" or conducting state. High voltages may be used to transfer charge to and remove charge from the floating gate through tunnel oxide dielectric 540 by various physical mechanisms such as avalanche injection, channel injection, direct quantum-mechanical tunneling, Fowler-Nordheim tunneling, hot electrons, and other phenomena.

Further details of the operation, program, and erase of nonvolatile devices such as EEPROM and Flash cells are discussed in U.S. Pat. No. 5,581,501, application Ser. No.

08/701,416, application Ser. No. 08/741,082, and application Ser. No. 08/915,519 all incorporated herein by reference for all purposes.

Figures 6A, 6B:
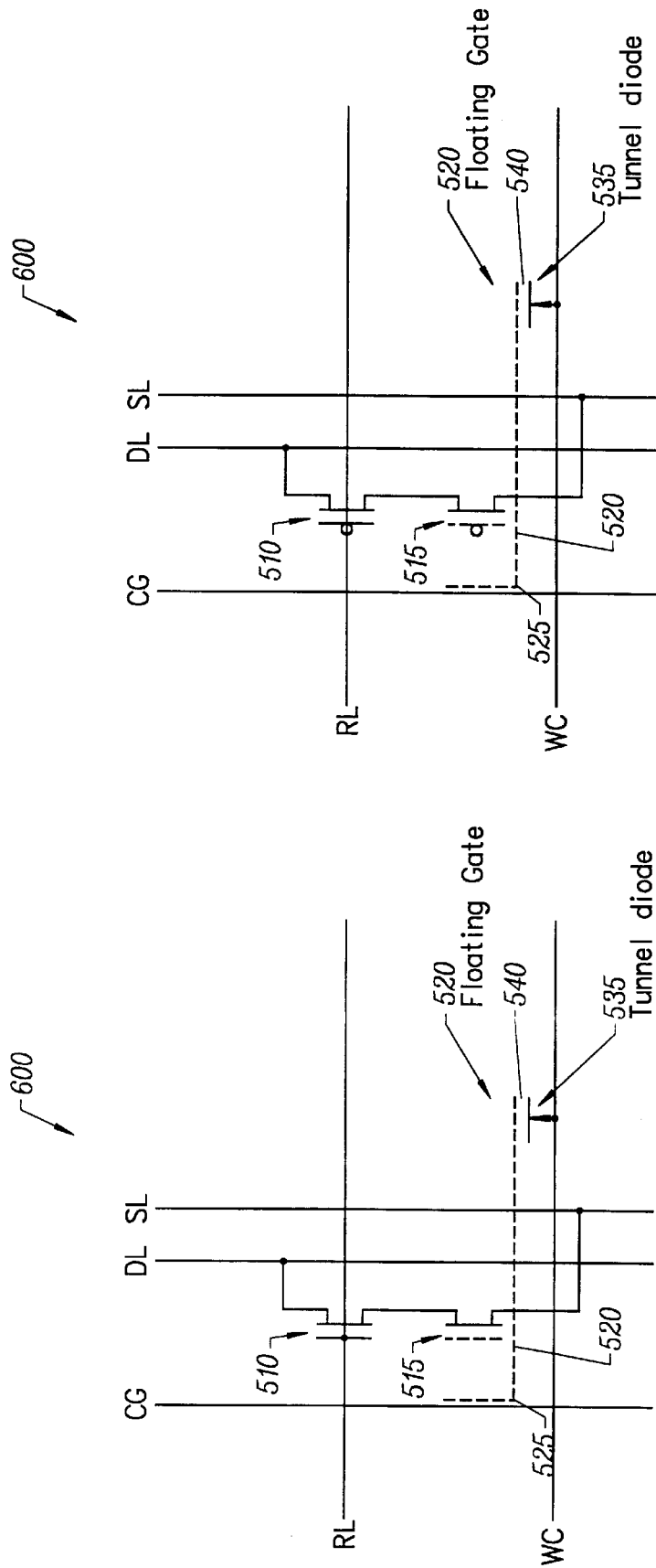
FIG. 6A shows a layout of memory cell of the present invention where a write control line is coupled to the tunnel diode.
FIG. 6B shows a layout of the memory cell of FIG. 6A using PMOS technology.

FIG. 6A shows an embodiment of a nonvolatile memory cell 600 of the present invention. Memory cell 600 shares similarities to memory cell 500 of FIG. 5A, and like reference numerals in FIG. 6A refer to similar features in FIG. 5A. Memory cell 600 includes a read device 510 and program device 515, coupled between DL and SL lines. Compared to memory cell 500 of FIG. 5A, a WC line for memory cell 600 is directly coupled to a tunnel diode 535. This allows a more compact cell size since a write device 530 is not need, and is omitted. By directly coupling WC to the tunnel diode, this does not affect the normal operation of memory cell 600, and stored data may be accessed similarly to that for memory cell 500. This allows memory cell 600 to be more easily interfaced into existing integrated circuit designs.

Figure 7B:
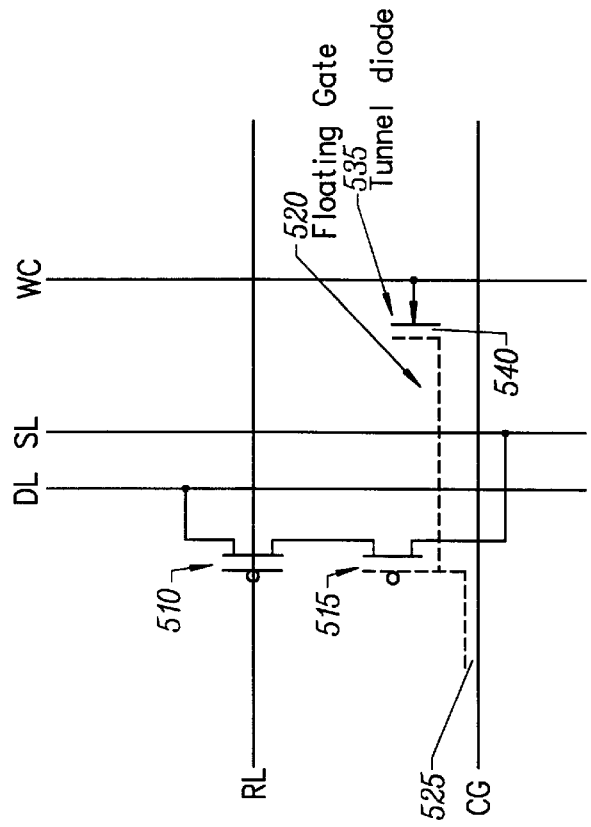
FIG. 7B shows a layout of the memory cell of FIG. 7A using PMOS technology.
Figure 7A:
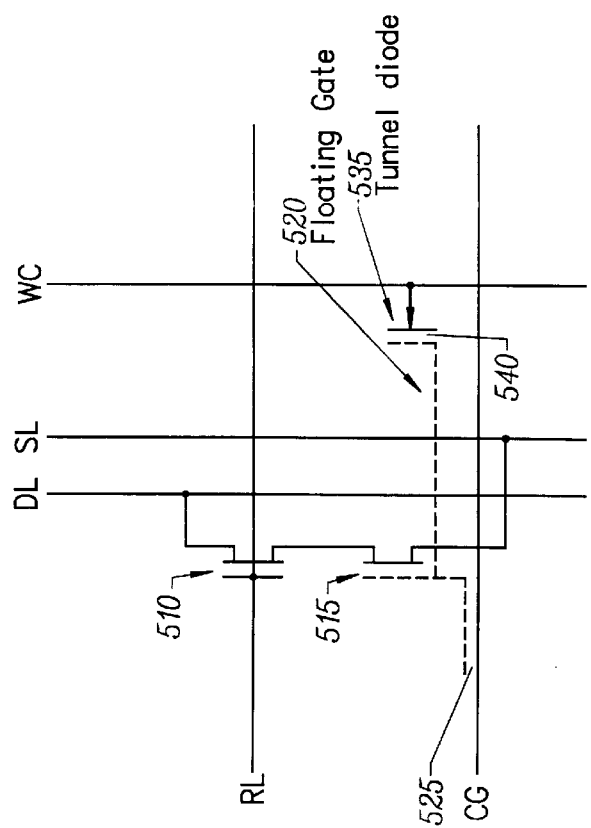
FIG. 7A shows an alternative layout for the memory cell of the present invention.

FIG. 6A shows one particular layout of the memory cell, and FIG. 7A shows an alternative layout. Notably, in the layout of FIG. 7A, the WC and CG lines are "flipped" compared to the layout in FIG. 6A. Control gate capacitors 525 and tunnel diodes 535 are also flipped. FIGS. 6A and 7A show merely two examples of layout for the memory cell, and there are a multitude of other layouts for the memory cell of the present invention. A description of the operation of the memory cell in FIG. 6A would also apply to that for FIG. 7A.

In an array of memory cells 600, to facilitate decoding, the CG and WC lines should be orthogonal and shared by cells of the same row or column, whichever applies. This is a layout consideration on CG which is different between the cells in FIG. 6A (and FIG. 7A) and FIG. 5A. However, this layout consideration should not generally impact the array size greatly since the layout of the cell in FIG. 2 is smaller due to the absence of the series access transistor. Overall, an array of cells of FIGS. 6A and 7A should be smaller or about the same size as an array of FIG. 5A cells.

A implementation of memory cell 600 using PMOS devices is shown in FIGS. 6B and 7B. Program, erase, and margin operation for memory cell 600 are as follows.

High voltages facilitate the program and erase of the memory cell. A high voltage ($V_{PP}$) used to program the memory cell may be somewhat different from a high voltage ($V_{EE}$) used to erase the memory cell. The magnitude of $V_{PP}$ and $V_{EE}$ depends on the physical characteristics of the memory cell including such considerations as the thickness and composition of the dielectric between the substrate and the floating gate. Typically, $V_{PP}$ and $V_{EE}$ voltages are in the range of approximately 10 volts to 16 volts. However, as process technology continues to improve, it will become possible to fabricate thinner and better tunnel oxide dielectrics. Consequently, the high voltages needed to program and erase the memory cell may decrease in magnitude. These high voltages may be generated on-chip by circuits such as charge pumps or voltage generators; or provided from sources external to the integrated circuit.

To erase program device 515, charge is electrically removed from the floating gate using high voltages and quantum-mechanical tunneling. After erasure, the program device may be reprogrammed. Flash EEPROM cells are generally programmed using hot electrons, while EEPROM cells are programmed using quantum-mechanical tunneling. In some cases, Flash EEPROM cells are programmed using quantum-mechanical tunneling. EEPROM and Flash cells may be programmed, erased, and reprogrammed many times for the lifetime of the device.

When the program device is programmed, charge is placed on a floating gate and in so doing, program device 515 is placed in a high threshold voltage state ($V_{TP}$ or high $V_T$). The floating gate retains this charged state indefinitely, even when power is not supplied to the memory cell; this provides nonvolatility. In the programmed or high $V_T$ state, a reasonable voltage on CG will not turn on program device 515.

A reasonable voltage may be, for example, a voltage between the supply voltages of the integrated circuit, $V_{DD}$ and $V_{SS}$; program device 515 will not conduct. A reasonable voltage may also be greater than $V_{DD}$. However, in the case when a voltage above $V_{TP}$ is placed at CG, the program device may turn on. For EEPROM and Flash EEPROM technology, the typical threshold voltage for a memory cell in a high $V_T$ state (i.e., $V_{TP}$) is, for example, approximately 6 volts. Moreover, when programmed using an "assist" technique (described below), the high $V_T$ state may be somewhat higher then 6 volts. For example, with CG at 2 volts, in the high $V_T$ state, program device 515 will be nonconducting or off.

When erasing the memory cell, charge is removed from the floating gate, and the program device is placed in a low $V_T$ state ($V_{TE}$). The floating gate retains this erased state for the life of the memory cell, even when power is not supplied. In the erased or low $V_T$ state, a reasonable voltage on a gate of the memory cell will turn the memory cell on. For Flash EEPROM technology the typical threshold voltage for a low $V_T$ state ranges from approximately 0.5 volts to 2.5 volts. For EEPROM technology, this may range from approximately −3 volts to 0 volts.

When erasing using a "smart" algorithm, a specific low $V_T$ voltage level state may be achieved. For example, the $V_{TE}$ may be about −1 volts. In another example, the $V_{TE}$ may be zero volts or slightly above zero volts. A smart algorithm removes charges from the floating gate using an iterative technique, removing small amounts of charge until a desired $V_{TE}$ is achieved. A smart algorithm may be used to prevent a negative $V_{TE}$, especially important in some applications where a negative $V_{TE}$ is undesirable such as for high-density, high-capacity Flash EEPROM memories. In other applications such as programmable logic devices, a negative low $V_T$ state may be allowable. For example, a negative $V_{TE}$ may be desirable in order to permit pass transistor 410 (in FIG. 4) to pass approximately full-rail voltages (e.g., $V_{CC}$ or $V_{DD}$) between a GH and a GV. In this case, the program device would be analogous to an NMOS depletion device.

Typically, arrays of programmable cells are "initialized" to a particular first state, and then they are configured by changing selected cells to a second state. The initiation state of an array is chosen based on many considerations including the process technology selected to fabricate the cells and the intended use of the cells, as well as the interconnections within an array. For example, Flash EEPROM cells are typically initialized by bulk erasing the cells to a low $V_T$ state. In contrast, an array of EEPROM cells is typically initialized by bulk programming the cells to a high $V_T$ state.

CG activates program device 515. During normal operation, CG is coupled to a voltage level which activates and enables operation of the memory device. To activate program device 515, CG is coupled to a voltage level which is greater than $V_{TE}$ and less than the $V_{TP}$. The voltage at the control gate may also be used to center a window of operation of the memory cell. For example, for typical EEPROM technology, a control gate voltage should be above about −1 volts ($V_{TE}$) and less than about 5 volts ($V_{TP}$).

The control gate may be coupled to a switching signal line, which provides voltages between $V_{SS}$ and $V_{DD}$. The control gate voltage may also be above $V_{DD}$. This may be used to improve performance of the memory cell.

In a preferred embodiment, to provide the greatest amount of programming and erase margin, the control gate voltage is selected to be at approximately the center of $V_{TE}$ and $V_{TP}$. For example, for EEPROM technology, the control gate voltage is set in the range from about 1.7 volts to about 2 volts. An activation voltage above $V_{DD}$ may also be used because among other reasons, this may be required by the memory element, or a higher voltage level is readily available. Also, this voltage level may center the window of operation of the memory cell. The control gate is also used during the programming of the memory cell, which is described in more detail below.

When utilizing EEPROM and Flash EEPROM technologies, the memory cell is erased using Fowler-Nordheim tunneling. For Flash operation, the memory cell (and corresponding program device) is initialized to an erased state. To initialize the program device to a low $V_T$ state, $V_{EE}$ is placed at WC which is passed directly to tunnel diode 535. Note that there is no $V_T$ voltage drop due to a series transistor to pass through, such as write device 530 in FIG. 5A. This allows a higher voltage to be coupled to the tunnel diode, and also removes the need for generating a voltage of $V_{EE}+V_{TN}$ to couple to a gate of write device 530.

As discussed earlier, $V_{EE}$ is a high voltage used for erasing the devices. $V_{EE}$ is typically in the range of 10 volts to 16 volts. CG is held at a low voltage, grounded or negative. When erasing, a negative assist programming technique may be used by placing a negative assist voltage on the control gate. For example, a voltage of −3 volts may be placed on control gate 670. This would decrease $V_{TE}$, improving the erase margin of program device 515.

Figure 8:
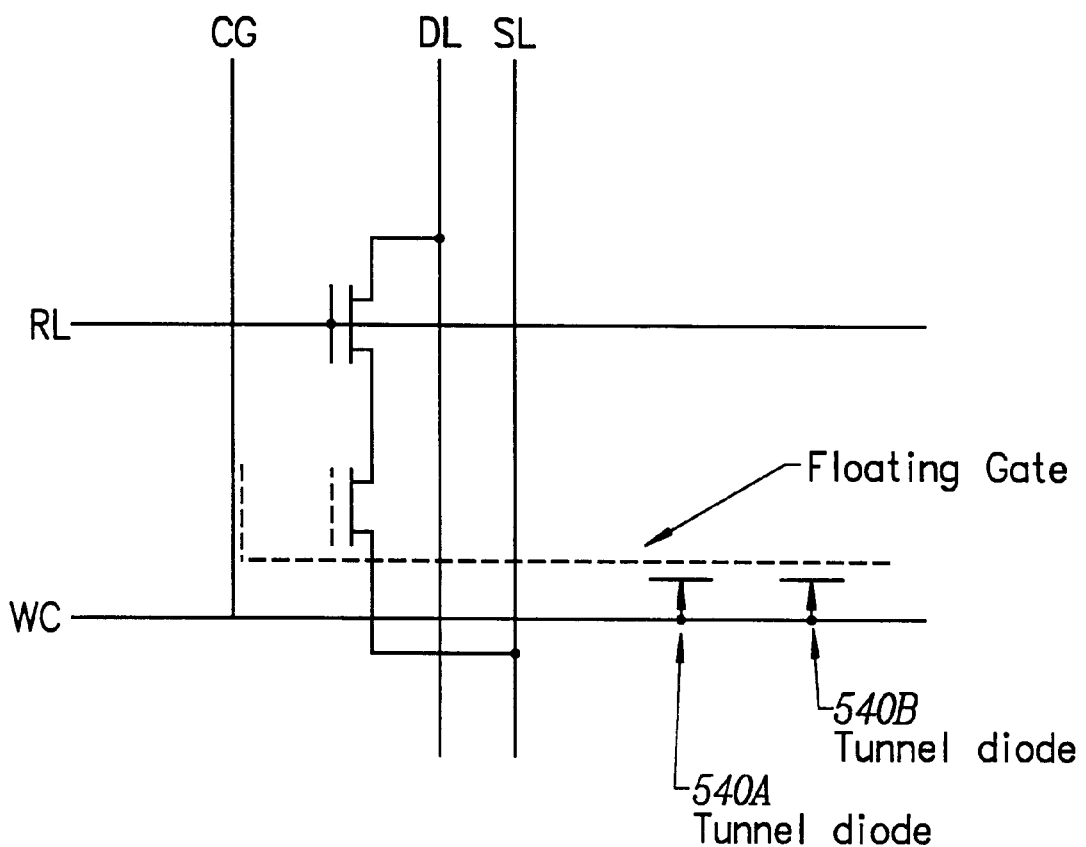
FIG. 8 shows a layout of a memory cell of the present invention having two tunnel diodes.

DL and SL may be grounded or biased to a low value. $V_{EE}$ is coupled directly to tunnel diode 535, without passing through a transistor device. Typically, one or more tunnel dielectrics 540 are positioned above tunnel diode 535. (FIG. 8 shows an example of a cell with multiple tunnel dielectrics 540A and 540B and tunnel diodes 535A and 535B.) In operation, from tunnel diode 535 (an n+ region), electrons may tunnel, in both directions, through the tunnel dielectric via quantum-mechanical tunneling to and from floating gate 520. High voltage $V_{EE}$ at tunnel diode 535 attracts electrons from the floating gate 520 via Fowler-Nordheim tunneling. This makes floating gate 520 more positively charged, and places program device 515 in a low $V_T$ state. The $V_{TE}$ may be approximately −2 volts.

Memory cell 600, and in particular, program device 515, may use EEPROM or Flash cells. Using Flash technology, the memory cells in an array of such devices are selectively programmed. To program, program device 515 is programmed to a high $V_T$ state. $V_{PP}$ is placed on CG. As discussed earlier, $V_{PP}$ is a high voltage used for programming the memory cells. $V_{PP}$ is typically in the range of about 10 volts to about 16 volts. This voltage also depends on the technology used, and may be lower such as 10 volts. A VPD voltage is placed on SL. VPD is selected to optimize the efficient programming of the devices. These considerations include ensuring that program device 515 is programmed well, minimizing any destructive effects on the devices, and observing the current density constraints of the power conductors. In one embodiment, VPD is about 8 volts. However, VPD may be in the range from about 5 volts to about 11 volts. RL is set at a voltage sufficient to turn read device 510 on: This voltage should be sufficiently high to permit read device 510 to pass a programming current. For example, this voltage may be $V_{PP}$ or even higher. DL is grounded. WC may be set to approximately the product of $V_{PP}$ times the control gate coupling ratio (e.g., a typical range of ratios is about 0.5 to 0.75) in order to relax stress across the tunnel oxide during hot electron programming.

Under these conditions, tunnel diode 535 has very little voltage stress and will not conduct; a significant current flows from SL through program device 515 and read device 510 to DL. For example, this current may be about five hundred microamps, or more. For example, current may be in the range from about five hundred microamps to seven hundred microamps. The range may be from about one hundred microamps to about one milliamp. There are devices which will program with currents of a few microamps, such as about one microamp to about 10 microamps or more. As technology improves, memory cells will be developed which will program with any desired range of currents. This current generates hot electrons, some of which jump a dielectric barrier (i.e., gate oxide or thin oxide) and become trapped in floating gate 520. Floating gate 520 becomes negatively charged. Program device 515 is programmed to a high $V_T$ state. $V_{TP}$ is typically 5 volts or higher.

In the above example, the programming current was generated in a direction from SL to DL. However, the memory cell may also be programmed by similarly inducing a programming current from DL to SL. In this particular case, VPD will be placed at DL and SL is grounded.

For EEPROM operation, the memory cell is programmed and erased using Fowler-Nordheim tunneling. This may be referred to as full $E^2$ operation. The memory cell is initialized by programming or bulk programming (for an array of cells) to a high $V_T$ state. CG is coupled to $V_{PP}$. DL, SL, and WC are grounded. RL may be grounded. Electrons tunnel from tunnel diode 535, which is grounded, through tunnel dielectric 540 to floating gate 520. As a result, program device 515 is programmed to the high $V_T$ state. $V_{TP}$ is typically about 5 volts or higher.

$V_{TP}$ may be boosted to a higher value by using an "assist" programming technique. In assist programming, when programming a memory cell, for example, SL is set at $V_{DD}$. Since CG is $V_{PP}$, the other terminal of program device 515 is also at about $V_{DD}$. Under these conditions, more electrons become trapped in the floating gate than under the programming conditions described previously. Hence, the floating gate is programmed to a higher $V_{TP}$.

Furthermore, this assist voltage may be any voltage above ground. For example, $V_{DD}$ may be used since this voltage is readily available. However, voltages above $V_{DD}$, such as $V_{PP}$, may also be used. Generally, the higher the assist voltage, the greater the boost in $V_{TP}$. The assist voltage may be applied to SL, and also may be coupled to DL, provided that the voltage at RL is sufficient to pass this voltage to program device 515.

For EEPROM operation, memory cells in an array are selectively erased to a low $V_T$ state. The erase operation is similar to that described for Flash operation above. Specifically, CG is grounded or placed at a negative voltage (for negative assist programming as discussed above). WC is coupled to $V_{EE}$. RL is coupled to ground or any other convenient voltage. DL and SL may be floating or grounded. Electrons will tunnel from floating gate 520 through tunnel dielectric 540 to tunnel diode 535. Program device 515 is erased to a low $V_T$ state.

Figure 9:
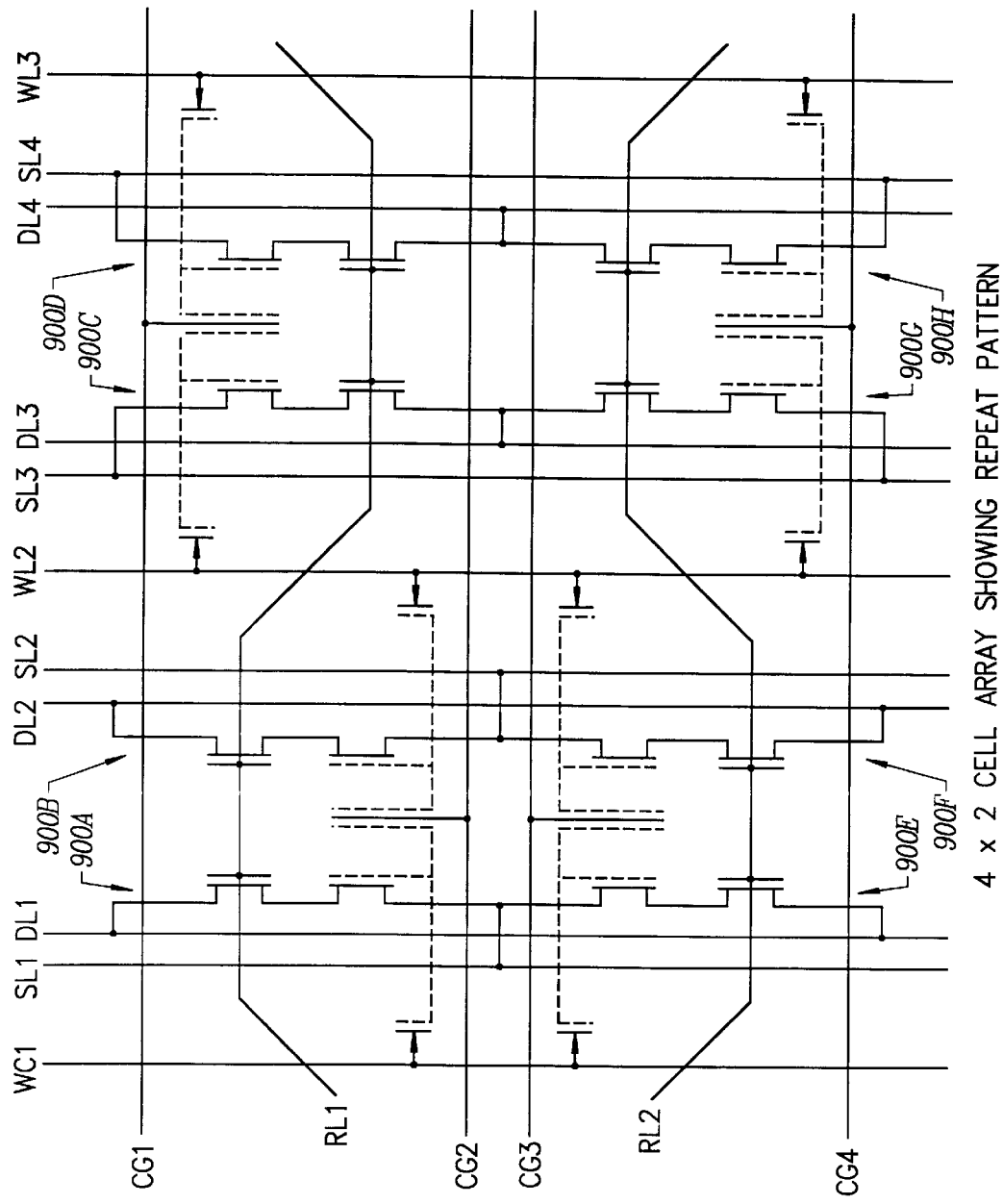
FIG. 9 shows a 4-by-2 array of memory cells of the present invention.

The above description discussed the program and erase operation for a selected cell or selected group of cells. A selected memory cell or group of cells is typically but one or more cells in a larger array of memory cells, most of which are typically to remain unchanged. FIG. 9 shows an example of a layout of a 4-by-2 array of memory cells 900A–900H of the present invention. In this particular embodiment, the memory cell layout of FIG. 7A is used. There are two rows and four columns of memory cells. In a horizontal direction, an RL1 line couples a first row of cells 900A–900D, and an RL2 lines a second row of cells 900E–900H. Also in the horizontal direction are control gate lines CG1, CG2, CG3, and CG4. CG1 couples to control gates of cells 900C and 900D; similarly, CG2 couples to cells 900A and 900B, CG3 couples to cells 900E and 900F, and CG4 couples to cells 900G and 900H.

In a vertical direction, WC1, SL1, and DL1 couple to memory cells 900A and 900E in a first column. Similarly, SL2 and DL2 couple to cells 900B and 900F in a second column; SL3 and DL3 couple to cells 900C and 900G in a third column. WC2 is shared between cells in the second and third columns; this gives a more compact layout for the array. DL4, SL4, and WC3 are coupled to cells 900D and 900H in a fourth column.

Another important consideration when programming or erasing a selected memory cell in an array of programmable such cells is to avoid altering or disturbing the programmed or erased state of the unselected programmed junctions. It is important during the selected program or selected erase operation for the unselected cells to remain in their programmed or erased state.

In the memory cell of the present invention, there is no write transistor to isolate the tunnel diode of unselected memory cells from voltages on a WC line during programming or erase operations. A potential problem, for example, is that the voltages and conditions used to induce the programming current for programming a memory cell by hot electron programming may disturb other memory cells (possibly in the same or adjacent row or column). For example, this voltage may program unselected memory cells by Fowler-Nordheim tunneling. Furthermore, during an erase operation by tunneling on a selected cell, the unselected cells should also remain undisturbed.

One technique to prevent disturb of unselected cells during selected program or selected erase is to use half-select voltages on control lines WC and CG, $V_{WC}$ and $V_{CG}$, respectively, for the unselected cells. In the case of hot electron programming, addressing can be achieved using RL and DL or SL decoding. All CG nodes can be at $V_{PP}$ during hot electron programming, and all WC nodes can be at a half-select voltage. A preferred WC half-select voltage is the product of $V_{PP}$ times the CG coupling ratio.

In the case of EEPROM selective erasure, the selected CG is grounded or negative. Selected WC lines are set to $V_{EE}$. A positive half-select voltage should be placed on unselected CG lines to prevent Fowler-Nordheim tunneling erasure through tunnel diodes sharing the selected WC lines and unselected CG lines. With this half-select voltage on unselected CG lines, additional half-select voltages may be needed on unselected WC lines to prevent Fowler-Nordheim tunneling programming through tunnel diodes sharing unselected CG lines and unselected WC lines. Finally, the combination of grounded or negatively biased selected CG lines should also not result in tunneling conduction through tunnel nodes sharing selected CG lines and the now biased unselected WC lines.

Figure 10:
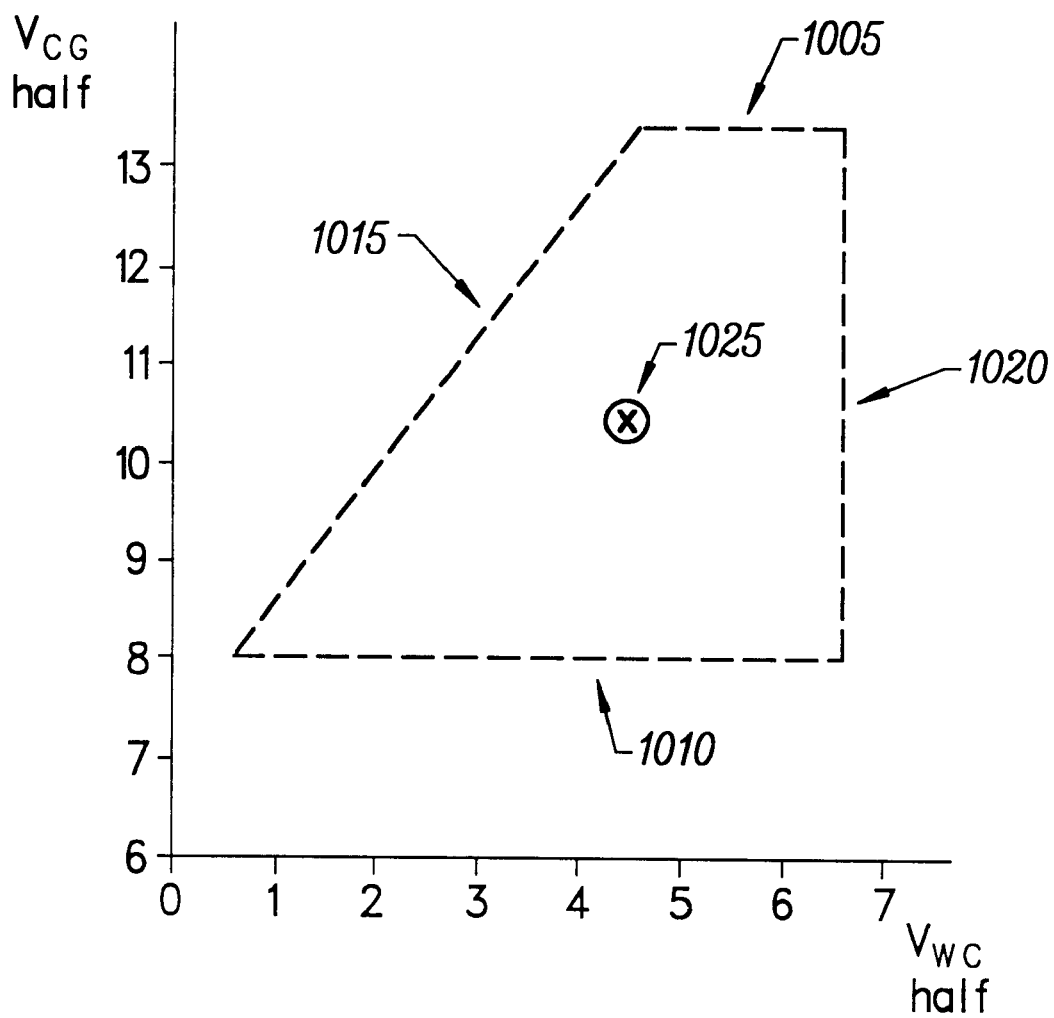
FIG. 10 shows a graph of an allowed space for half-select voltages for the WC and CG lines for a particular set of cell and programming parameters.

For a given cell design and program and erase conditions, there will be a locus of allowed half-select voltages to avoid disturb effects. An example of such a locus is shown in FIG. 10 for a particular set of conditions. Allowed half-select voltages are bounded by dashed lines 1005, 1010, 1015, and 1020. FIG. 10 shows a locus for the following conditions:

$V_{CG}$ is grounded for selected CG lines.
$V_{WC}$ is about 12.5 volts for selected WC lines.
$V_{SL}$ and $V_{DL}$ are grounded during erase.
$V_{FG(no\ bias)}$ is about −2.0 volts after blanket programming for 100 milliseconds. This requires a $V_{PP}$ of about 13.3 volts.
Tunnel oxide thickness is about 90 Å.
An erase time is about 10 milliseconds.
A coupling ratio from CG to FG is about 0.67.
A coupling ratio from tunnel node to FG is about 0.11.

Under these conditions, $V_{FG(no\ bias)}$ after selective erase is about 2.0 volts, and the locus of allowed half-select voltages is shown in FIG. 10. The locus is arbitrarily cut off at $V_{CGhalf}$ of about $V_{PP}$ (e.g., 13.3 volts) indicated by dashed line 1005. The $V_{CGhalf}$ voltage may be greater than 13.3 volts. Dashed line 1020 represents a maximum $V_{WChalf}$ which can be employed without disturbing a cell on a selected CG and unselected WC. In this case, the maximum $V_{WChalf}$ is about 6.4 volts. Dashed line 1010 represents a minimum $V_{CGhalf}$ required to avoid disturbing a cell on a selected WC and unselected CG. In this case, the minimum $V_{CGhalf}$ is about 8.1 volts.

Dashed line 1015 represents a relationship between $V_{WChalf}$ and $V_{CGhalf}$ for CG lines and WC lines which are both unselected. As $V_{CGhalf}$ is raised, $V_{WChalf}$ must also be raised to maintain a sufficiently low voltage stress across the tunnel node to prevent disturb. By choosing a pair of values such as $V_{WChalf}$ of about 4.4 volts and $V_{CGhalf}$ of about 10.4 volts, an operating point may be selected in roughly the center of the allowed locus (indicated by an operating point 1025). This operating point 1025 provides over about 2 volts of tolerance in all voltage directions.

FIG. 10 is merely an example of a particular case. Many other cell parameters and programming conditions might be chosen, and each would have its own particular locus. Furthermore, an operating point may be chosen which is not centered in the locus. Some reasons and considerations when selecting an operating point include convenience in generating the necessary half-select voltage, or because of known asymmetries in process or programming condition variation, as well as other reasons. For example, the half-select voltages used may be generated on-chip by using bias generators, charge pumps, and the like, or supplied from off-chip sources.

A specific example of an application of the technique of the present invention is to the array of memory cells in FIG. 9. Taking cell 900G as a representative selected cell, CG4 is grounded or negative, and WC2 is set to $V_{EE}$, about 12.5 volts. SL and DL lines (i.e., SL1 to SL4 and DL1 to DL4) are grounded. A positive half-select voltage (of about 10.4 volts) is placed on unselected CG lines (i.e., CG1 to CG3) to prevent disturb from Fowler-Nordheim tunneling programming. A positive half-select voltage (of about 4.4 volts) may be placed on unselected WC lines to prevent disturb from Fowler-Nordheim tunneling programming. Under these conditions, selected cell 900G would be selectively erased and unselected cells should remain undisturbed in their previously configured states. Although this example has been described with respect to one selected cell, this technique would also apply in the case where multiple cells are to be selectively configured.

A margin of the memory cell of the present invention may be evaluated using techniques described in application Ser. No. 08/915,519, especially in the case for negative $V_{TE}$ voltages.

The foregoing description of preferred embodiments of the invention has been presented for the purposes of illustration and description. It is not intended to be exhaustive or to limit the invention to the precise form described, and many modifications and variations are possible in light of the teaching above. The embodiments were chosen and described in order to best explain the principles of the invention and its practical applications to thereby enable others skilled in the art to best utilize the invention in various embodiments and with various modifications as are suited to the particular use contemplated. It is intended that the scope of the invention be defined by the claims appended hereto.

What is claimed is:

1. A memory cell comprising:
    a first transistor coupled between a drain line and an internal node, wherein a control electrode of the first transistor is coupled to a row line;
    a second transistor coupled between the internal node and a source line, wherein the second transistor comprises a floating gate coupled to a control gate line; and
    a write control line coupled directly to a tunnel diode of the memory cell.

2. The memory cell of claim 1 wherein the write control line is connected to the tunnel diode without passing through a transistor device.

3. The memory cell of claim 1, further comprising:
    a control gate capacitor coupled between the floating gate and the control gate.

4. The memory cell of claim 1 wherein the second transistor is a Flash device.

5. The memory cell of claim 1 wherein the second transistor is a EEPROM device.

6. The memory cell of claim 1 further comprising:
    a tunnel dielectric, wherein charge is transferred between the tunnel diode and the floating gate through the tunnel dielectric.

7. An array of memory cells of claim 6 wherein a plurality of half-select voltages are coupled to unaccessed control gate and write control lines of the array of memory cells to avoid disturbing a state of unaccessed cells.

8. A memory cell comprising:
    a first transistor coupled between a drain line and an internal node, wherein a control electrode of the first transistor is coupled to a row line;
    a second transistor coupled between the internal node and a source line, wherein the second transistor comprises a floating gate coupled to a control gate line;
    a write control line coupled directly to a tunnel diode of the memory cell;
    a tunnel dielectric, wherein charge is transferred between the tunnel diode and the floating gate through the tunnel dielectric; and a bias voltage is supplied to the tunnel diode.

9. The memory cell of claim 8 wherein the bias voltage is supplied on the write control line.

10. The memory cell of claim 8 wherein the bias voltage is selected to reduce a voltage stress across the tunnel dielectric.

11. The memory cell of claim 8 wherein the bias voltage is selected to center a window of operation of the memory cell.

12. A memory cell comprising:
    a first transistor coupled between a drain line and an internal node, wherein the first transistor is a p-channel device having a control electrode coupled to a row line;
    a second transistor coupled between the internal node and a source line, wherein the second transistor is a p-channel device having a control electrode coupled to a control gate line and the second transistor stores a nonvolatile logic state; and
    a write control line coupled to a tunnel diode.

13. The memory cell of claim 12 wherein the second transistor is a Flash transistor, EEPROM transistor, or floating gate device.

14. The memory cell of claim 12 wherein the write control line is directly coupled to the tunnel diode.

15. The memory cell of claim 12 further comprising:
    a write transistor coupled between the write control line and the tunnel diode, wherein the write transistor is a p-channel device having a control electrode coupled to the row line.

16. An electronic system comprising a memory cell as recited in claim 15.

17. The memory cell of claim 15 wherein a threshold voltage of the second transistor is electrically altered by applying a programming voltage to the control gate line.

18. The memory cell of claim 17 wherein the programming voltage is in a range from about 8 volts to about 13 volts.

19. A method of selectively configuring a selected memory cell in an array of memory cells comprising:
    placing a ground voltage or negative voltage on a control gate node of the selected memory cell;
    placing a $V_{EE}$ voltage at a tunnel diode node of the selected memory cell;
    providing a first half-select voltage;
    providing a second half-select voltage;
    placing the first half-select voltage to control gate nodes of memory cells other than the selected memory cell; and
    placing the second half-select voltage to tunnel diode nodes of the memory cells other than the selected memory cell.

20. The method of claim 19 wherein the first half-select voltage is below $V_{EE}$.

21. The method of claim 19 wherein the second half-select voltage is selected to be about a product of a control gate coupling ratio and a $V_{PP}$ voltage.

22. The method of claim 19 wherein $V_{EE}$ is a voltage above about 9 volts.

23. The method of claim 19 wherein the second half-select voltage is selected to maintain a sufficiently low voltage stress across tunnel nodes of the memory cells other than the selected memory cells to prevent disturb.

24. A method of configuring a selected memory cell in an array comprising:
    providing voltages to control lines of the selected memory cell to place the selected memory cell in a desired configured state; and
    providing a first half-select voltage to a first control line of an unselected memory cell, wherein the first half-select voltage is an intermediate voltage between ground and a $V_{PP}$ voltage.

25. The method of claim 24 wherein the first and second control lines are laid out in transverse directions.

26. The method of claim 24 wherein the first half-select voltage is in a range from about 8 volts to about 13 volts.

27. The method of claim 24 wherein the first control line is coupled to a control gate node of the unselected memory cell.

28. The method of claim 24 wherein the selected memory cell comprises a floating gate transistor, PMOS transistor, nonvolatile memory cell, NMOS transistor, Flash cell, EPROM cell, or electrically erasable memory cell.

29. The method of claim 24 wherein the configured state is a programmed state.

30. The method of claim 24 wherein the $V_{PP}$ voltage is about 13 volts or less.

31. The method of claim 24 wherein the $V_{PP}$ voltage is applied to one of the control lines of the selected memory cell.

32. The method of claim 24 wherein one of the control lines of the selected memory cell is directly coupled to a tunnel diode of the selected memory cell.

33. The method of claim 24 wherein after the selected memory cell is configured, the unselected memory cell remains in its previously configured state.

34. The method of claim 24 further comprising:
providing a second half-select voltage to a second control line of the unselected memory cell, wherein the second half-select voltage is different from the first half-select voltage.

35. The method of claim 34 wherein a maximum for the second half-select voltage is about 6 volts.

36. The method of claim 34 wherein the second control line is coupled to a tunnel diode node of the unselected memory cell.

37. The method of claim 34 wherein the second half-select voltage is about 6 volts or below.

38. The method of claim 34 wherein the second half-select voltage is in a range from about 0.5 volts to about 6.5 volts.

39. The method of claim 38 wherein one of the voltages provided to control lines of the selected memory cell to place the selected memory cell in a desired configured state is in a range from about 8 volts to about 13 volts.

* * * * *